(12) United States Patent
Morooka

(10) Patent No.: US 6,658,639 B2
(45) Date of Patent: Dec. 2, 2003

(54) SEMICONDUCTOR INTEGRATED CIRCUIT PROVIDED WITH DETERMINATION CIRCUIT

(75) Inventor: Yoshikazu Morooka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 221 days.

(21) Appl. No.: 09/860,612

(22) Filed: May 21, 2001

(65) Prior Publication Data

US 2002/0026623 A1 Feb. 28, 2002

(30) Foreign Application Priority Data

Aug. 22, 2000 (JP) .......................................... 2000-251027

(51) Int. Cl.$^7$ ............................................... G06F 17/50
(52) U.S. Cl. ............................................ 716/17; 716/4
(58) Field of Search ....................... 716/17, 4; 365/200, 365/201

(56) References Cited

U.S. PATENT DOCUMENTS 4,155,121 A * 5/1979 Jambotkar ................... 365/200

FOREIGN PATENT DOCUMENTS

JP          9-55096          2/1997

* cited by examiner

Primary Examiner—Sara Crane
(74) Attorney, Agent, or Firm—McDermott, Will & Emery

(57) ABSTRACT

A semiconductor integrated circuit capable of determining a configuration of a plurality of elements included in a functional block is provided. The semiconductor integrated circuit includes a memory functional block with a variable storage capacity, a functional block, and a terminal group for testing. A plurality of sub blocks are formed in the memory functional block when a chip is formed. Each of the plurality of sub blocks includes a determination circuit having substantially the same structure and function. A signal is input to the determination circuit from the terminal group, and a signal output through the determination circuit is observed at the terminal group. This enables determination of the configuration (the number, positional relationship, or the like) of the sub blocks.

12 Claims, 7 Drawing Sheets

SEMICONDUCTOR INTEGRATED CIRCUIT PROVIDED WITH DETERMINATION CIRCUIT

BACKGROUND OF THE INVENTION

1. Field of the Invention

The present invention relates to semiconductor integrated circuits and, more particularly, to a semiconductor integrated circuit provided with a circuit for determining a configuration of a functional block.

2. Description of the Background Art

A conventional semiconductor integrated circuit is provided with a separate determination circuit for obtaining configuration information on a functional block of the semiconductor integrated circuit, in addition to the functional block.

However, the above mentioned conventional determination circuit is arranged corresponding to a desired functional block (of a specific configuration), so that configuration information cannot be provided if the configuration of the functional block is not represented by a desired value.

We now consider the case where the functional block includes a plurality of elements, which are formed by a program (automatic circuit synthesis function) when a chip is formed. In this case, the configuration information, particularly an arrangement pattern, of the plurality of elements actually formed, cannot be determined until the chip is formed. Thus, a conventional determination circuit does not provide configuration information (arrangement pattern or the like) on the plurality of elements.

A similar problem is caused if a desired configuration is not achieved due to a design problem. In such a case, it is difficult to detect malfunction.

SUMMARY OF THE INVENTION

The present invention provides a semiconductor integrated circuit capable of reliably determining a configuration of a functional block.

The semiconductor integrated circuit according to one aspect of the present invention is provided with a functional block having a plurality of elements, which has a configuration determination circuit capable of determining a configuration of the plurality of elements because of the plurality of elements.

Preferably, the configuration determination circuit includes a plurality of determination circuits having substantially the same function.

Particularly, the plurality of determination circuits are electrically connected in accordance with the configuration of the plurality of elements.

The functions of the plurality of determination circuits are determined when the plurality of elements are formed on a semiconductor substrate, and determination is performed by the functions.

Preferably, the configuration determination circuit determines the number of elements and/or arrangement pattern of the plurality of elements.

Preferably, the configuration determination circuit is formed by interconnections. The plurality of determination circuits have substantially the same pattern of interconnections. Particularly, the interconnections are insulated from power supply lines.

Preferably, a terminal for inputting/outputting a signal for determination of the configuration of the plurality of elements in a test mode is further provided. In the test mode, the signal is input from the terminal to the configuration determination circuit, and the signal representing the determination result of the configuration determination circuit is output from the terminal.

Preferably, a power supply line is further provided for supplying power, and the configuration determination circuit is insulated from the power supply line.

According to the above mentioned semiconductor integrated circuit of the present invention, configuration information on the plurality of elements of the functional block can readily be determined by the configuration determination circuit of the plurality of elements.

Thus, even when the configuration of the plurality of elements is variable (when the plurality of elements are arranged automatically through a program), such configuration can be determined by the plurality of elements. Even when the plurality of elements are formed under control of the program when a chip is formed, the configuration thereof can be reliably determined. Particularly, the arrangement and the number of the plurality of elements can be determined as the configuration.

In addition, once the plurality of elements are formed, the internal configuration thereof needs not be changed, but their functions enable determination. Accordingly, subsequent change to the internal configuration is not necessary, and malfunction due to the changing operation (in programming) is prevented.

The determination circuit is formed in the plurality of elements, so that reliable determination is achieved while eliminating adverse affect by other internal circuits, elements, or the like.

Note that external application of a test signal allows the configuration of the functional block to be readily determined.

Further, the determination circuit can be formed by interconnections. Thus, malfunction of the determination circuit due to a design problem of an active element (such as a transistor) can be prevented.

Moreover, insulation from the power supply line eliminates adverse affect by the power supply line.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
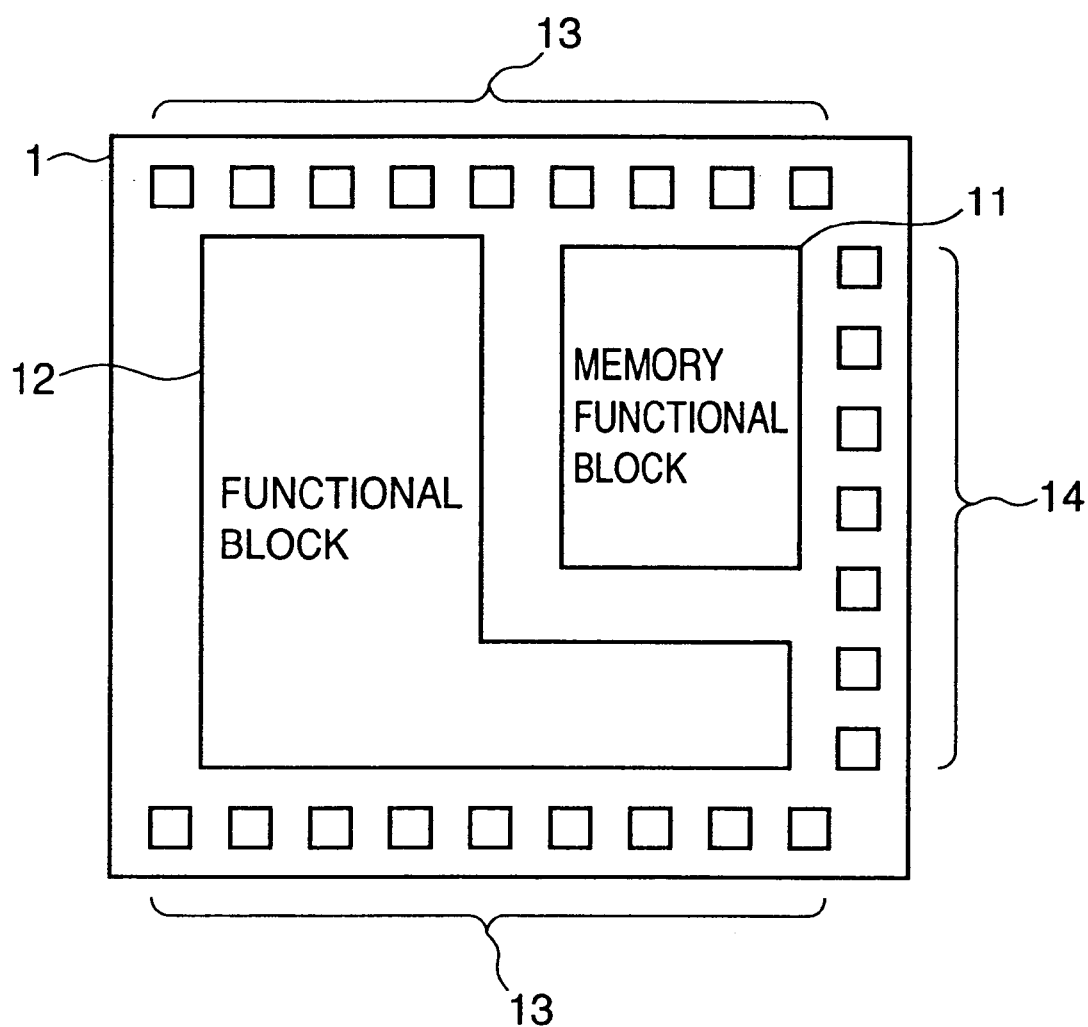
FIG. 1 is a view schematically showing a configuration of a semiconductor integrated circuit 1 according to a first embodiment.

Now, semiconductor integrated circuits according to the embodiments of the present invention will be described with reference to the drawings. The same or corresponding portions are denoted by the same reference numerals and the description thereof will not be repeated.

First Embodiment

A semiconductor integrated circuit 1 of the first embodiment will be described. Referring to FIG. 1, semiconductor integrated circuit 1 of the first embodiment includes a memory functional block 11 with variable storage capacity, a functional block 12 different from memory functional block 11, a group of terminals 13 for inputting/outputting signals during normal use, and a group of terminals for testing 14. Let us assume that the memory functional block has a maximum storage capacity of 32 M bits. When a chip is formed, a plurality of sub blocks are formed in the memory functional block in accordance with a program (automatic formation).

Figure 2:
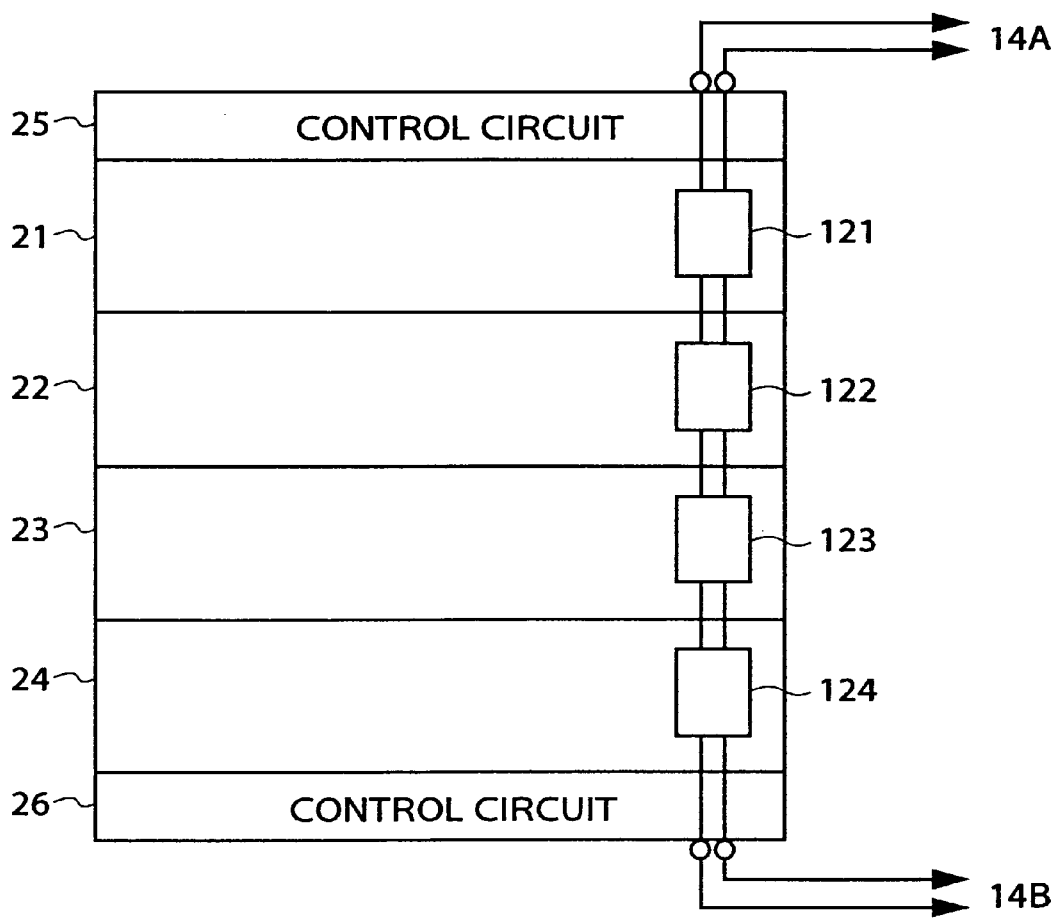
FIG. 2 is a diagram showing a configuration of a memory functional block 11 according to the first embodiment.

As shown in FIG. 2, memory functional block 11 includes control circuits 25, 26 for writing/reading to/from memory cells, and sub blocks 21, 22, 23, 24 each having a plurality of memory cells. Each of sub blocks 21 to 24 has a storage capacity of 8 M bits.

Each of sub blocks 21 to 24 includes determination circuits 121 to 124. Determination circuits 121 to 124 are formed when respective sub blocks are formed. Determination circuits 121 to 124 have the same structure and function.

When sub blocks 21 to 24 are arranged in series as shown in FIG. 2, determination circuits 121 to 124 are connected in series. Input/output terminals of determination circuits 121 and 124 are respectively connected to terminal groups for testing 14A and 14B.

In obtaining configuration information on the functional block (in a test mode), a test signal is input to a determination circuit from terminal group for testing 14A (or 14B), and any change in the test signal is detected from the other terminal group for testing 14B (or 14A) through the determination circuit.

Exemplary structures of determination circuits 121 to 124 will be described in the following. As stated previously, determination circuits 121 to 124 have the same structure. In the test mode, the configuration of a plurality of elements (sub blocks) is determined based on the configuration when the sub blocks are formed.

Figure 3:
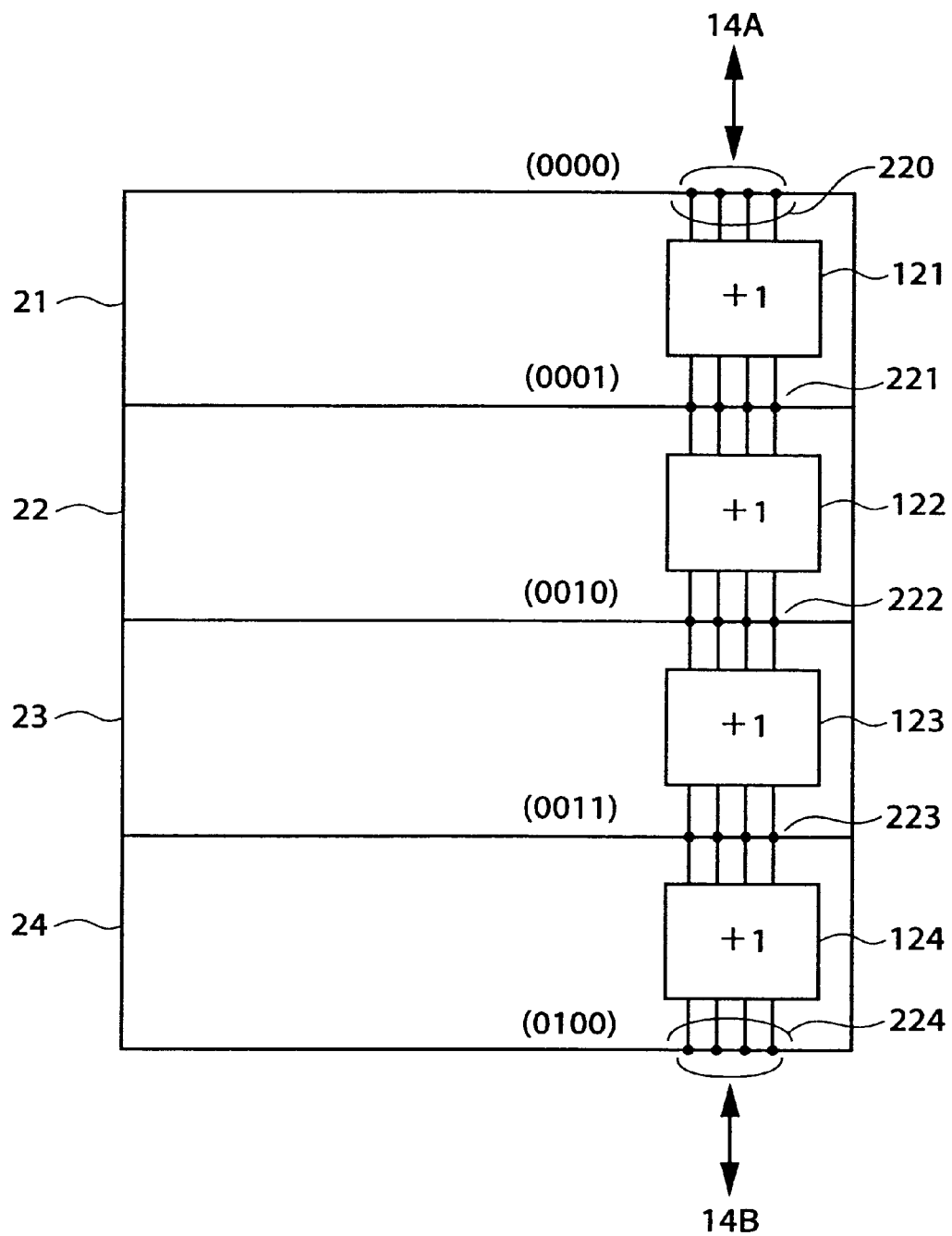
FIG. 3 is a diagram showing an exemplary configuration of a determination circuit according to the first embodiment.

Exemplary structures of the determination circuits are shown in FIG. 3. Each of determination circuits 121 to 124 shown in FIG. 3 has two sets of input/output terminals of 4 bits and a counter function of outputting a value, obtained by adding "1" to the signal received at one input/output terminal group, to the other input/output terminal group.

The first input/output terminal group of determination circuit 121 is electrically connected to terminal group 14A for testing. The second input/output terminal group of determination circuit 121 is electrically connected to the first input/output terminal group of determination circuit 122, whereas the second input/output terminal group of determination circuit 122 is electrically connected to the first input/output terminal group of determination circuit 123. Further, the second input/output terminal group of determination circuit 123 is electrically connected to the first input terminal group of determination circuit 124, whereas the second input terminal group of determination circuit 124 is electrically connected to terminal group for testing 14B.

In the drawing, the first input/output terminal group of determination circuit 121 is denoted by reference numeral 220, the second input/output terminal group of determination circuit 121 and the first input/output terminal group of determination circuit 122 are denoted by 221, the second input/output terminal group of determination circuit 122 and the first input/output terminal group of determination circuit 123 are denoted by 222 the s second input/output terminal group of determination circuit 123 and the first input/output terminal group of determination circuit 124 are denoted by 223, and the second input/output terminal group of determination circuit 124 is denoted by 224.

If a signal "0000" is input to input/output terminal group 220, a signal "0001" is output to input/output terminal group 221 by determination circuit 121. Thereafter, a signal "0010" is output to input/output terminal group 222 by determination circuit 122. Then, a signal "0011" is output to input/output terminal group 223 by determination circuit 123. Further, a signal "0100" is output to input/output terminal group 223 by determination circuit 124.

Thus, given that four sub blocks (functional blocks) are arranged in series as shown in FIGS. 2 and 3, input of "0000" from terminal group for testing 14A produces output of "0100" from terminal group for testing 14B. As a result, it is confirmed that four functional blocks are connected in series.

Figure 4:
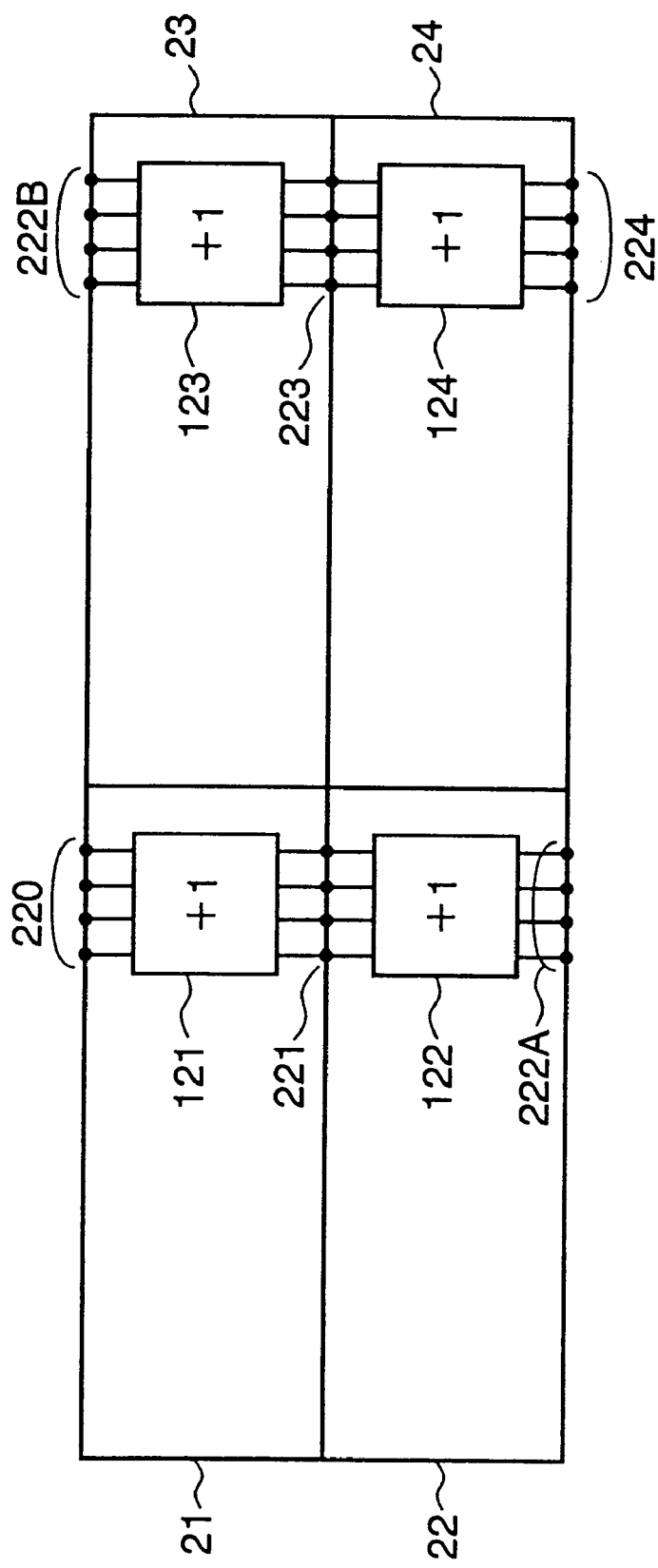
FIG. 4 is a diagram showing another exemplary configuration shown in conjunction with determination according to the present invention.

The output varies according to the number or arrangement of the elements. Thus, the configuration of the plurality of elements is reliably determined. Referring to FIG. 4, in the case of a semiconductor integrated circuit having four sub blocks arranged in a 2×2 pattern, for example, an output would be different from that described above. More specifically, sub blocks 21 and 22 are arranged in series and sub blocks 23 and 24 are arranged in series adjacent to the arrangement of sub blocks 21 and 22. Then, input of "0000" to first input/output terminal group 220 of determination circuit 121 produces output of "0010" from second input/output terminal group 222A of determination circuit 122. Input of "0000" to first input/output terminal group 222B of determination circuit 123 produces output of "0010" from second input/output terminal group 224 of determination circuit 124.

As described above, the determination circuits for determining the configuration of the plurality of elements included in the functional block are formed when the functional block is formed on the semiconductor substrate. In addition, once formed, the internal state thereof remains unchanged. Unlike the conventional case, there is no need to separately form a determination circuit in addition to the functional block for determining the functional block. Further, the functions of the determination circuits are used for determination to provide determination result without changing the state of the determination circuit.

Second Embodiment

Figure 5:
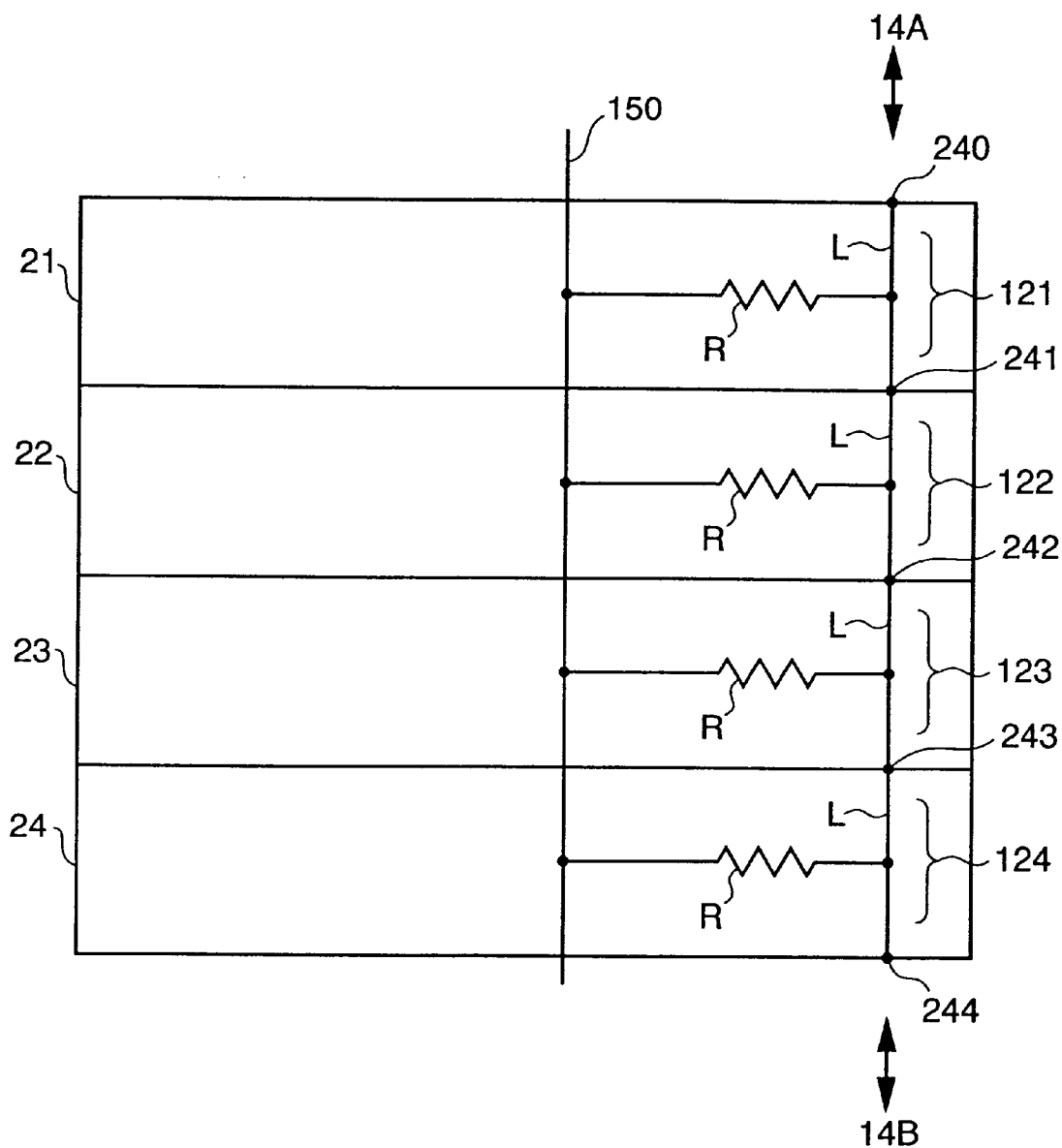
FIG. 5 is a diagram showing an exemplary configuration of a determination circuit according to a second embodiment.
Figure 6:
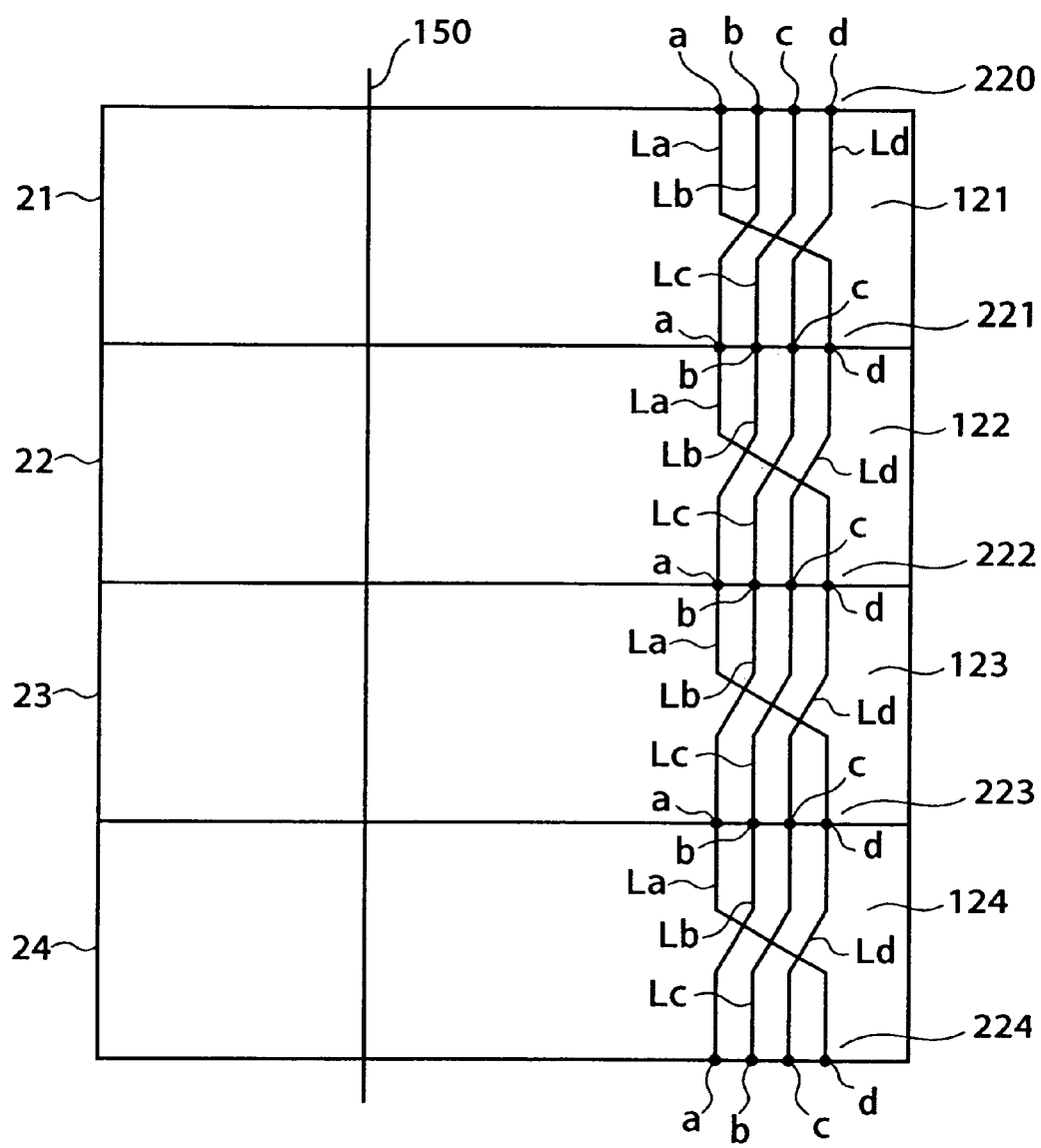
FIG. 6 is a diagram showing an exemplary configuration of a determination circuit according to a third embodiment.
Figure 7:
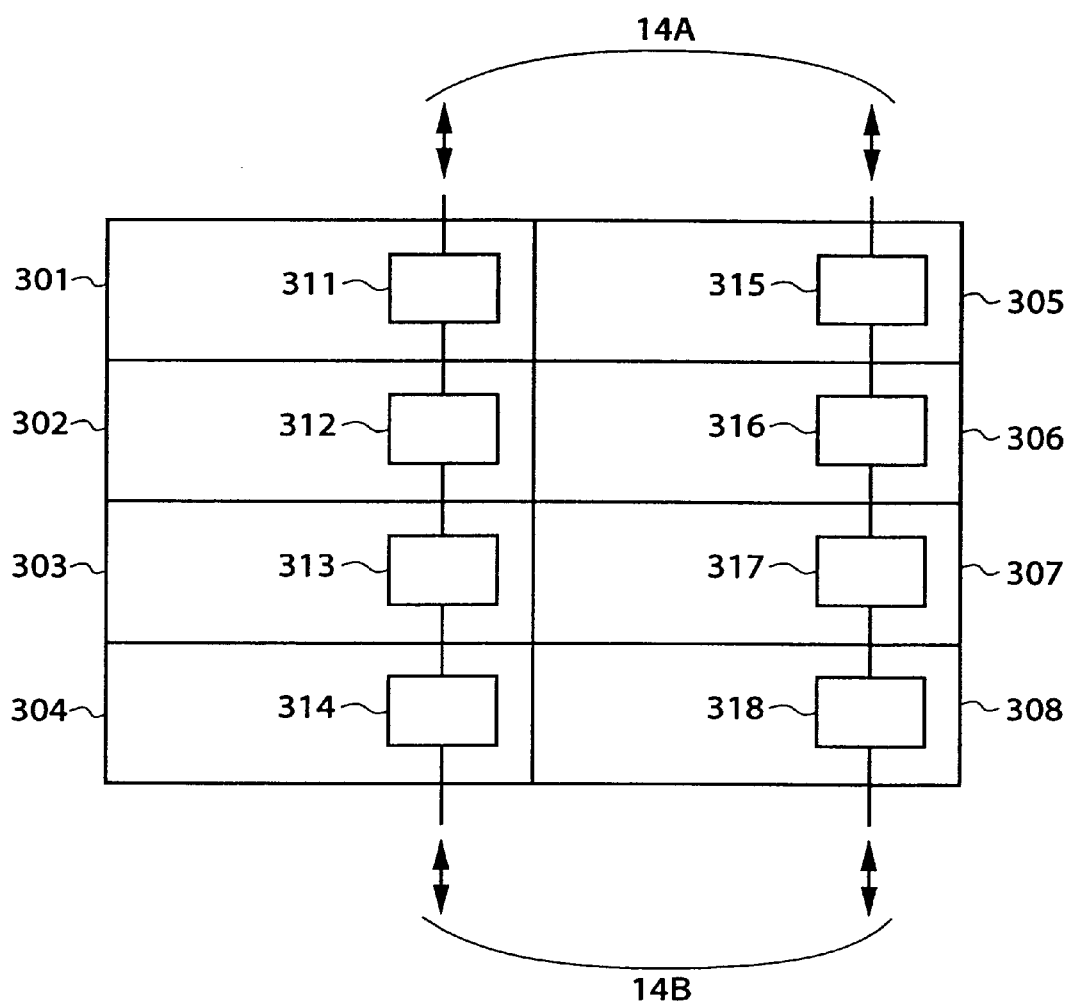
FIG. 7 is a diagram showing a plurality of elements in functional blocks, by way of example.

In the second embodiment, a determination circuit is formed without using any active terminal such as a counter or transistor. For example, an interconnection (of aluminum, polysilicon or the like) is used. Each of determination circuits 121 to 124 shown in FIG. 5 has a resistor R and an interconnection L.

In the drawing, a reference numeral 150 indicates a power supply line for supplying a power supply voltage required for operation of the chip. For example, power supply line 150 supplies a ground voltage GND. Resistor R is connected to power supply line 150 and interconnection L.

In the drawing, reference numeral 240 indicates the first terminal of interconnection L of determination circuit 121.

Reference numeral 241 indicates the second terminal of interconnection L of determination circuit 121 and the first terminal of interconnection L of determination circuit 122. Reference numeral 242 indicates the second terminal of interconnection L of determination circuit 122 and the first terminal of interconnection L of determination circuit 123. Reference numeral 243 indicates the second terminal of interconnection L of determination circuit 123 and the first terminal of interconnection L of determination circuit 124. Reference numeral 224 indicates the second terminal of interconnection L of determination circuit 124. In the arrangement pattern shown in the drawing, interconnections L of determination circuits 121 to 124 are connected in series.

Terminals 240 and 244 are electrically connected to terminal groups 14A and 14B for testing, respectively.

By comparing a current amount of a signal applied to terminal 240 with that of the signal output from terminal 244, the configuration of sub blocks (four in total, arranged in series) can be determined.

Third Embodiment

In the third embodiment, a determination circuit is formed using an interconnection (of aluminum, polysilicon, or the like). Each of determination circuits 121 to 124 has four interconnections La, Lb, Lc, and Ld, as well as two input/output terminal groups of 4 bits, arranged corresponding to the interconnections.

In the drawing, reference characters a, b, c, and d respectively indicate the first to fourth terminals forming input/output terminal groups 220 to 224. Interconnections La to Lc are arranged in a given pattern, connecting one and the other input/output terminal groups.

Interconnection La is arranged between a first terminal a of one input/output terminal group and a fourth terminal d of the other input/output terminal group. Interconnection Lb is arranged between a second terminal b of one input/output terminal group and first terminal a of the other input/output terminal group. Interconnection Lc is arranged between a third terminal c of one input/output terminal group and second terminal b of the other input/output terminal group. Interconnection Ld is connected between fourth terminal d of one input/output terminal group and third terminal c of the other input/output terminal group. Interconnections La to Ld cannot be electrically connected one another.

All of determination circuits 121 to 124 have the same pattern of interconnections La to Ld.

In a test mode, a test signal is input from input/output terminal group 220 (or 224) through terminal group 14A (or 14B) for testing. The test signal is transmitted through interconnections and output from terminal group 14B (or 14A) for testing through input/output terminal group 224 (or 220). The input test signal is compared with the output test signal.

A specific example is given here. Assume that a test signal "0001" is input to input/output terminal group 220. In other words, signals at L level are input to first to third terminals a to c, and a signal at H level is input to fourth terminal d.

The signal at H level reaches input/output terminal group 224 through interconnection Ld of determination circuit 121, interconnection Lc of determination circuit 122, interconnection Lb of determination circuit 123, and interconnection La of determination circuit 124. In this case, by comparing the terminal to which the signal at H level has been input with the terminal which outputs the signal at H level, the number of components (sub blocks as functional blocks) and arrangement pattern thereof can be determined.

Formation of the determination circuit without using any active element as described above prevents malfunction of the determination circuit due to a design problem in a process of manufacturing active elements such as transistors.

Further, in the third embodiment, power supply line 150 is electrically insulated from interconnections La, Lb, Lc, and Ld. This ensures normal operation of the determination circuit even if a problem arises due to the power supply line per se. Moreover, the configuration can be determined by the functions of the determination circuits per se while eliminating adverse affect by other internal circuits and element through the power supply line.

Although the embodiments of the present invention have been described as having a plurality of sub blocks of which configuration is determined, by way of example. However, the present invention is not limited to these embodiments. The present invention can also be applied if the functional blocks include substantially the same elements 301, 303, 305, and 307, as well as substantially the same elements 302, 304, 306, and 308, which are different from element 301. The above described effect can be produced by using circuits implementing substantially the same configurations and functions, for determination circuits 311 to 318 respectively included in elements 301 to 308.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit, comprising:
a functional block including a plurality of sub blocks each having substantially a same function and configuration; and
a configuration determination circuit for determining a configuration of said functional block; wherein
said configuration determination circuit includes a plurality of determination circuits each having substantially a same function and respectively arranged in said plurality of sub blocks, receives a signal, and outputs a varied signal representing the configuration of said functional block constructed of said plurality of sub blocks, based on a combination of the configuration of said plurality of determination circuits.

2. The semiconductor integrated circuit according to claim 1, wherein said plurality of determination circuits are electrically connected according to the configuration of said plurality of sub blocks.

3. The semiconductor integrated circuit according to 1, wherein said function of said plurality of determination circuits is determined when said plurality of sub blocks are formed on a semiconductor substrate, and said determination is performed by said function.

4. The semiconductor integrated circuit according to claim 1, wherein said configuration determination circuit determines the number of said plurality of sub blocks.

5. The semiconductor integrated circuit according to claim 1, wherein said configuration determination circuit determines an arrangement pattern of said plurality of sun blocks.

6. The semiconductor integrated circuit according to claim 1, wherein said plurality of determination circuits have substantially the same pattern of interconnections.

7. The semiconductor integrated circuit according to claim 1, further comprising a terminal for inputting/ outputting a signal for determining the configuration of said plurality of sub blocks in a test mode, wherein a signal is input from said terminal to said configuration determination circuit in said test mode and a signal indicating a determination result of said configuration determination circuit is output from said terminal.

8. The semiconductor integrated circuit according to claim 1, further comprising a power supply line for supplying power, wherein said configuration determination circuit is insulated from said power supply line.

9. The semiconductor integrated circuit according to claim 6, further comprising a power supply line for supplying power, wherein said configuration determination circuit is insulated from said power supply line.

10. The semiconductor integrated circuit according to claim 1, wherein said signal represents a voltage signal.

11. The semiconductor integrated circuit according to claim 1, wherein said signal represents a current signal.

12. A semiconductor integrated circuit, comprising:

a functional block including a plurality of elements, said plurality of elements having a configuration determination circuit for determining a configuration of said plurality of elements by formation of said plurality of elements; and a first terminal and a second terminal provided respectively for input/output to/from said configuration determination circuit; wherein the determination of said configuration of said plurality of elements is performed based on a result of an input/output varying from said first terminal of said configuration determination circuit to said second terminal.

* * * * *

UNITED STATES PATENT AND TRADEMARK OFFICE
CERTIFICATE OF CORRECTION

PATENT NO. : 6,658,639 B2
DATED : December 2, 2003
INVENTOR(S) : Marooka

It is certified that error appears in the above-identified patent and that said Letters Patent is hereby corrected as shown below:

<u>Title page,</u>
Item [73], Assignee, should read -- Renesas Technology Corp.,
Tokyo, Japan --

Signed and Sealed this

Twenty-seventh Day of January, 2004

JON W. DUDAS
*Acting Director of the United States Patent and Trademark Office*